(12) United States Patent
McCarten et al.

(10) Patent No.: US 8,318,580 B2
(45) Date of Patent: Nov. 27, 2012

(54) ISOLATING WIRE BONDING IN INTEGRATED ELECTRICAL COMPONENTS

(75) Inventors: John P. McCarten, Penfield, NY (US); Cristian A. Tivarus, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 262 days.

(21) Appl. No.: 12/769,695

(22) Filed: Apr. 29, 2010

(65) Prior Publication Data
US 2011/0269292 A1 Nov. 3, 2011

(51) Int. Cl.
*H01L 21/761* (2006.01)

(52) U.S. Cl. .............. 438/414; 438/618; 257/E21.597; 257/E21.544

(58) Field of Classification Search .......... 438/106–127, 438/612–617, 618–651, 414
See application file for complete search history.

(56) References Cited

U.S. PATENT DOCUMENTS

| | | | |
|---|---|---|---|
| 5,057,041 A | 10/1991 | Yu et al. | |
| 5,318,666 A | 6/1994 | Elkind et al. | |
| 5,652,150 A | 7/1997 | Wadsworth et al. | |
| 5,949,061 A | 9/1999 | Guidash et al. | |
| 6,107,655 A | 8/2000 | Guidash | |
| 6,218,656 B1 | 4/2001 | Guidash | |
| 7,586,139 B2 | 9/2009 | Adkisson et al. | |
| 2003/0235991 A1 | 12/2003 | Schulte et al. | |
| 2006/0199365 A1 | 9/2006 | Wilner | |
| 2008/0265348 A1 | 10/2008 | Maas et al. | |
| 2009/0020842 A1 | 1/2009 | Shiau et al. | |
| 2010/0109006 A1 | 5/2010 | Kobayashi et al. | |
| 2011/0266658 A1 | 11/2011 | McCarten et al. | |

FOREIGN PATENT DOCUMENTS

| | | |
|---|---|---|
| EP | 2 081 229 A2 | 7/2009 |
| EP | 2 120 264 A2 | 11/2009 |
| JP | 2005 285814 A | 10/2005 |

OTHER PUBLICATIONS

U.S. Office Action mailed Feb. 21, 2012, U.S. Appl. No. 12/769,697, filed Apr. 29, 2010 (15 pages).
PCT/US2011/034165; International Search Report and the Written Opinion of the International Searching Authority, mail date Jul. 22, 2011, (9 pages).
PCT/US2011/034168; International Search Report and the Written Opinion of the International Searching Authority, mail date Jul. 22, 2011, (9 pages).
U.S. Office Action mailed Dec. 20, 2011, U.S. Appl. No. 12/769,697, filed Apr. 29, 2010 (7 pages).
U.S. Office Action mailed Jun. 18, 2012, U.S. Appl. No. 12/769,697, filed Apr. 29, 2010 (9 pages).

*Primary Examiner* — Savitr Mulpuri
(74) *Attorney, Agent, or Firm* — Blakely Sokoloff Taylor & Zafman LLP

(57) ABSTRACT

An electrical component includes a semiconductor layer having a first conductivity type and a interconnect layer disposed adjacent to a frontside of the semiconductor layer. At least one bond pad is disposed in the interconnect layer and formed adjacent to the frontside of the semiconductor layer. An opening formed from the backside of the semiconductor layer and through the semiconductor layer exposes at least a portion of the bond pad. A first region having a second conductivity type extends from the backside of the semiconductor layer to the frontside of the semiconductor layer and surrounds the opening. The first region can abut a perimeter of the opening or alternatively, a second region having the first conductivity type can be disposed between the first region and a perimeter of the opening.

4 Claims, 14 Drawing Sheets

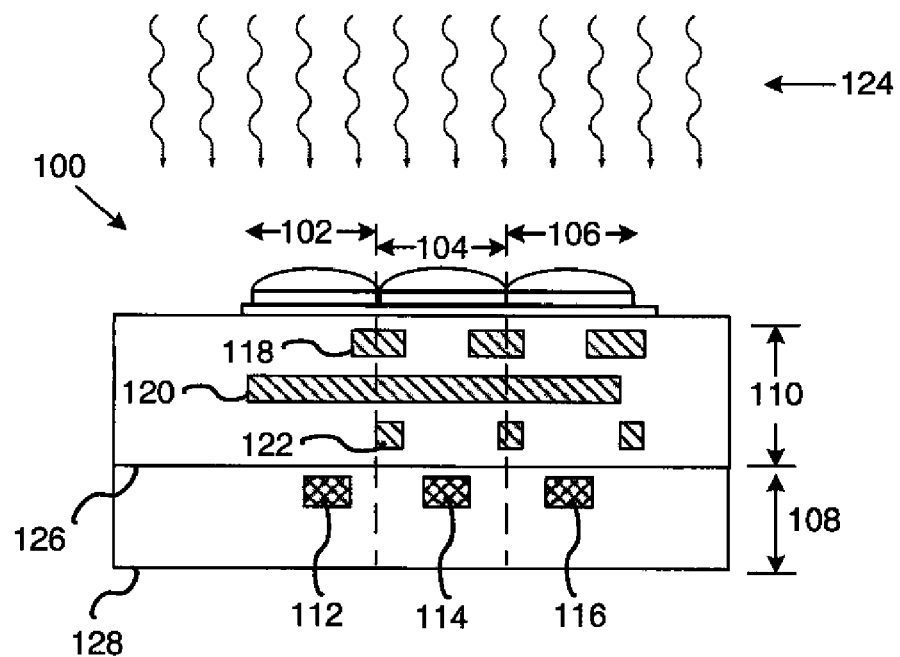
FIG. 1 - Prior Art
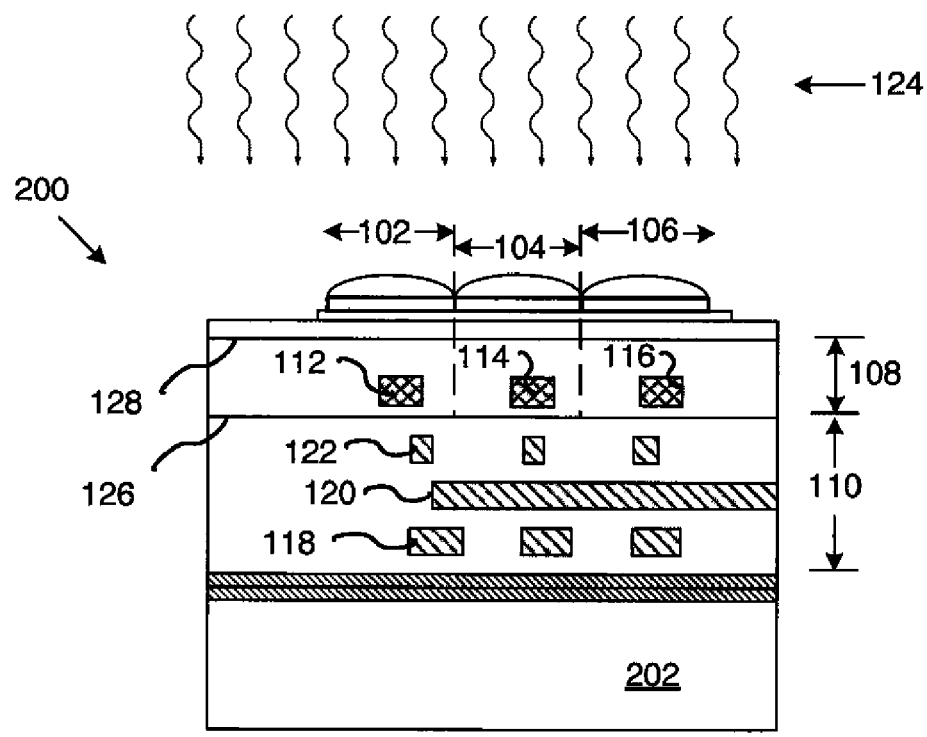
FIG. 2 - Prior Art

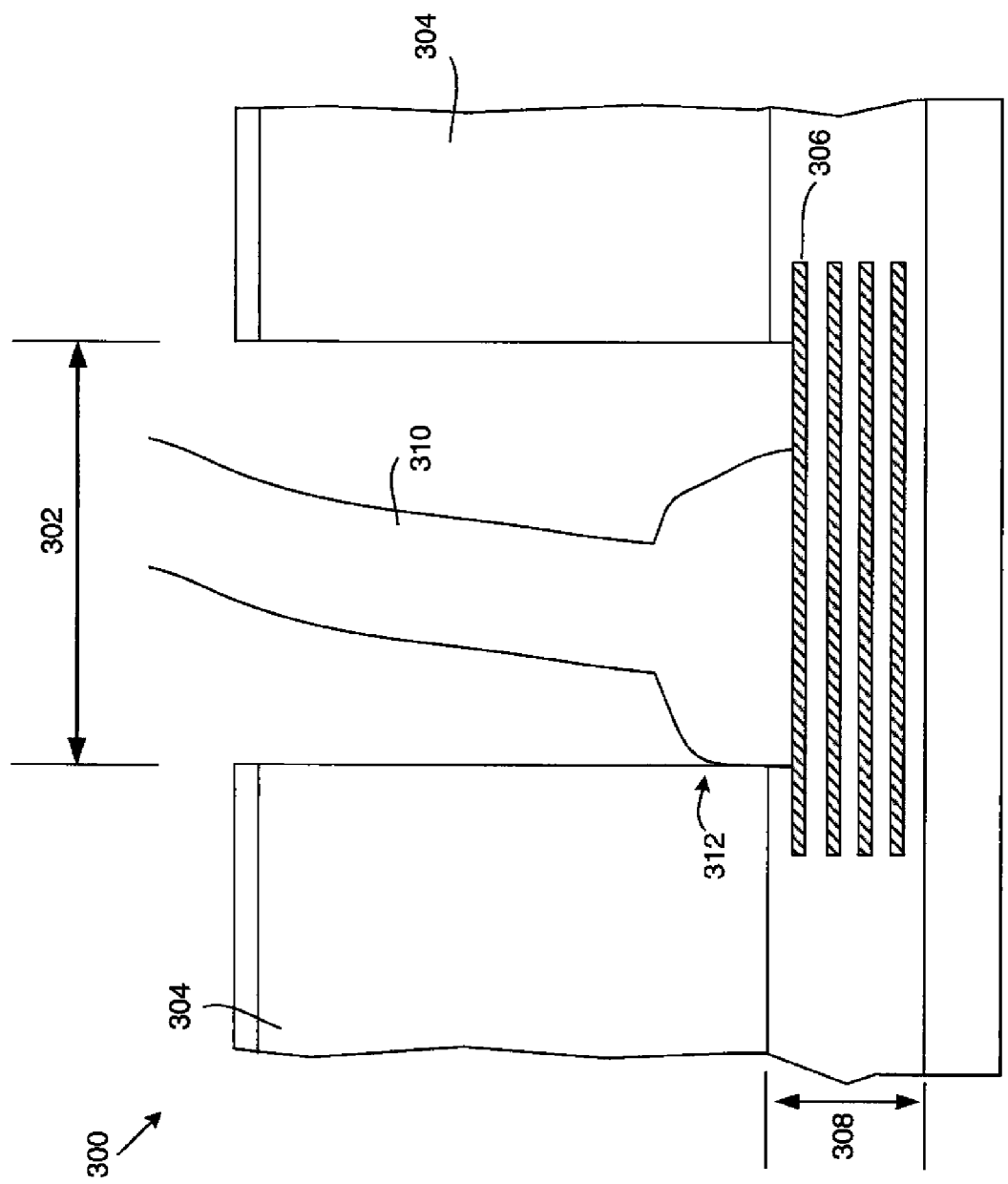
FIG. 3 - Prior Art

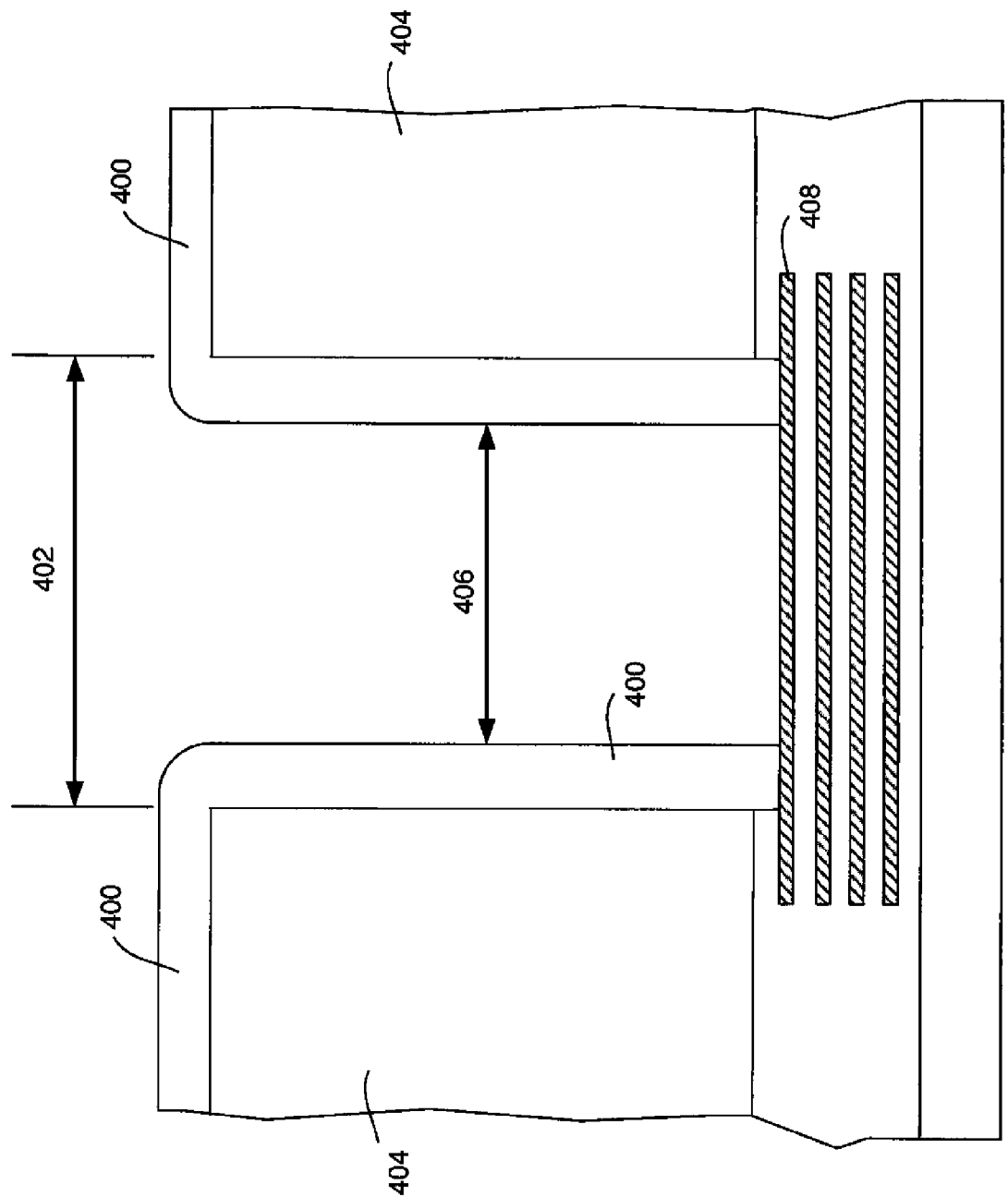
FIG. 4 - Prior Art

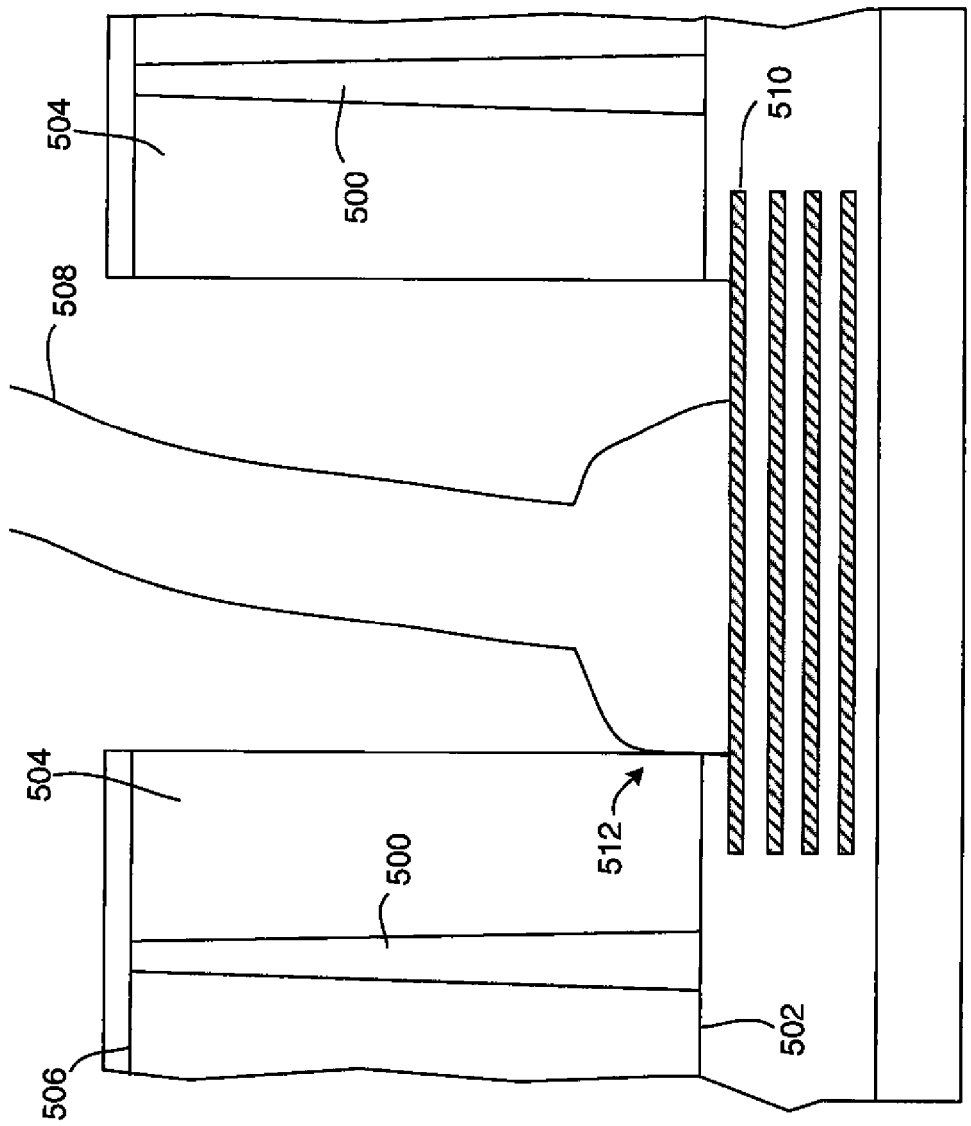
FIG. 5 - Prior Art

ISOLATING WIRE BONDING IN INTEGRATED ELECTRICAL COMPONENTS

CROSS-REFERENCE TO RELATED APPLICATION

This patent application is related to U.S. application Ser. No. 12/769,697, entitled "Isolated Wire Bonding in Integrated Electrical Components" and filed concurrently herewith.

TECHNICAL FIELD

The present invention relates to integrated electrical components, and more particularly to isolating wire bonding in integrated electrical components having a semiconductor material overlying a bond pad and a wire affixed to the bond pad through an opening in the semiconductor material.

BACKGROUND

An image sensor captures images using light-sensitive photosensitive areas that convert incident light into electrical signals. Image sensors are generally classified as either front-illuminated image sensors or back-illuminated image sensors. FIG. 1 is a simplified illustration of a front-illuminated image sensor in accordance with the prior art. Image sensor 100 includes pixels 102, 104, 106 formed within a semiconductor layer 108 and an interconnect layer 110. Photosensitive areas 112, 114, 116 are formed in semiconductor layer 108. Conductive interconnects 118, 120, 122, such as gates and connectors, are formed in interconnect layer 110.

Unfortunately, the positioning of conductive interconnects 118, 120, 122, and various other features associated with interconnect layer 110, over photosensitive areas 112, 114, 116 adversely impacts the fill factor and quantum efficiency of image sensor 100. This is because light 124 from a subject scene must pass through interconnect layer 110 before it is detected by photosensitive areas 112, 114, 116.

A back-illuminated image sensor addresses these fill factor and quantum efficiency issues by constructing the image sensor such that light from a subject scene is incident on a backside of the semiconductor layer 108. The "frontside" 126 of semiconductor layer 108 is conventionally known as the side of semiconductor layer 108 that abuts interconnect layer 110, while the "backside" 128 is the side of semiconductor layer 108 that opposes frontside 126. FIG. 2 is a simplified illustration of a back-illuminated image sensor 200 in accordance with the prior art. Interconnect layer 110 is positioned between support substrate 202 and semiconductor layer 108. This allows light 124 to strike the backside 128 of semiconductor layer 108, where it is detected by photosensitive areas 112, 114, 116. Light detection by photosensitive areas 112, 114, 116 is no longer impacted by the metallization level interconnects and other features of interconnect layer 110.

One of the other features associated with interconnect layer 110 are bond pads. Bond pads are used to transmit signals to, and receive signals from, various circuits and components in an integrated electrical component, such as an image sensor. A wire affixed to a bond pad is electrically connected to one or more circuits or components in the image sensor. FIG. 3 is a graphical illustration of a wire affixed to a bond pad in a back-illuminated image sensor 300 in accordance with the prior art. Opening 302 is formed through semiconductor layer 304 to expose a bond pad 306 in interconnect layer 308. If wire 310 contacts semiconductor layer 304 when affixed to bond pad 306, such as at area 312, wire 310 is electrically connected to semiconductor layer 304 and produces an electrical short to the image sensor. The electrical short renders the image sensor unusable. Electrical shorts like this are not an issue for front-illuminated image sensors because the bond pads are in the interconnect layer which is positioned above the semiconductor layer. The bond wire is not able to contact the semiconductor layer.

Electrical shorts can also occur at wafer level testing when a tester accidentally touches semiconductor layer 304 with a probe pin. The tester may report the die is faulty when there is no actual problem with the image sensor.

Failures at both package and wafer testing reduce yield, and hence increase costs. Several isolation techniques have been used to prevent electrical shorts from damaging the image sensors. FIG. 4 is a graphical depiction of a first isolation technique in back-illuminated image sensors in accordance with the prior art. A conformal insulating material 400 is deposited over the image sensor and lines the sidewalls of opening 402. The insulating material 400 electrically isolates semiconductor layer 404 from a wire (not shown). The conformal insulating material 400, however, narrows the width 406 of opening 402 such that in some situations, a wire can not be affixed to bond pad 408 because the wire is larger than width 406.

FIG. 5 is a graphical illustration of a second isolation technique in back-illuminated image sensors in accordance with the prior art. Deep trench isolation regions 500 are formed with dielectric material and extend from the frontside 502 of semiconductor layer 504 to the backside 506 of semiconductor layer 504. If wire 508 contacts semiconductor layer 504 when affixed to bond pad 510, such as at area 512, deep trench isolation regions 500 electrically isolate semiconductor layer 504 and prevent wire 508 from producing an electrical short to the image sensor. Unfortunately, the fabrication of deep trench isolation regions is a complex procedure that requires many processing steps. This complexity increases the cost to produce image sensors that utilize this isolation technique.

SUMMARY

Embodiments of the invention can be implemented in any integrated electrical component having a semiconductor layer or material overlying a bond pad and a wire affixed to the bond pad through an opening in the semiconductor layer or material. An integrated electrical component includes a semiconductor layer having a first conductivity type and an interconnect layer disposed adjacent to a frontside of the semiconductor layer. At least one bond pad is disposed in the interconnect layer and formed adjacent to the frontside of the semiconductor layer. An opening formed from the backside of the semiconductor layer and through the semiconductor layer exposes at least a portion of the bond pad. A first region having a second conductivity type extends from the backside of the semiconductor layer to the frontside of the semiconductor layer and surrounds the opening. The first region can abut a perimeter of the opening or alternatively, a second region having the first conductivity type can be disposed between the first region and a perimeter of the opening.

A method for isolating a wire affixed to a bond pad in an electrical component includes forming a first region having a first conductivity type in a portion of a semiconductor layer having a second conductivity type. The first region extends from a backside of the semiconductor layer to a frontside of the semiconductor layer and the first conductivity type is opposite the second conductivity type. An opening is formed from the backside of the semiconductor layer through the semiconductor layer to expose at least a portion of a bond pad disposed in an interconnect layer adjacent to the frontside of the semiconductor layer. A wire can then be affixed to the bond pad.

In one embodiment in accordance with the invention, the first region comprises a well and the opening is formed through the well. The remaining portion of the well surrounds and abuts a perimeter of the opening.

In another embodiment in accordance with the invention, the first region surrounds a portion of the semiconductor layer and the opening is formed through the surrounded portion of the semiconductor layer. The remaining portion of the surrounded portion of the semiconductor layer abuts a perimeter of the opening and the first region surrounds the opening and abuts the remaining portion of the surrounded portion of the semiconductor layer.

And in yet another embodiment in accordance with the invention, the first region surrounds a portion of the semiconductor layer and a well of the second conductivity type is formed in the surrounded portion of the semiconductor layer. The opening is formed through the well such that the remaining portion of the well surrounds and abuts a perimeter of the opening. The first region surrounds the opening and abuts the remaining portion of the well and surrounded portion in the semiconductor layer.

BRIEF DESCRIPTION OF THE DRAWINGS

Embodiments of the invention are better understood with reference to the following drawings. The elements of the drawings are not necessarily to scale relative to each other.

FIG. 1 is a simplified cross-sectional illustration of a front-illuminated image sensor according to the prior art;

FIG. 2 is a simplified cross-sectional illustration of a back-illuminated image sensor according to the prior art;

FIG. 3 is a graphical illustration of a wire affixed to a bond pad in a back-illuminated image sensor in accordance with the prior art;

FIG. 4 is a graphical depiction of a first isolation technique in back-illuminated image sensors in accordance with the prior art;

FIG. 5 is a graphical illustration of a second isolation technique in back-illuminated image sensors in accordance with the prior art;

DETAILED DESCRIPTION

Figure 6:
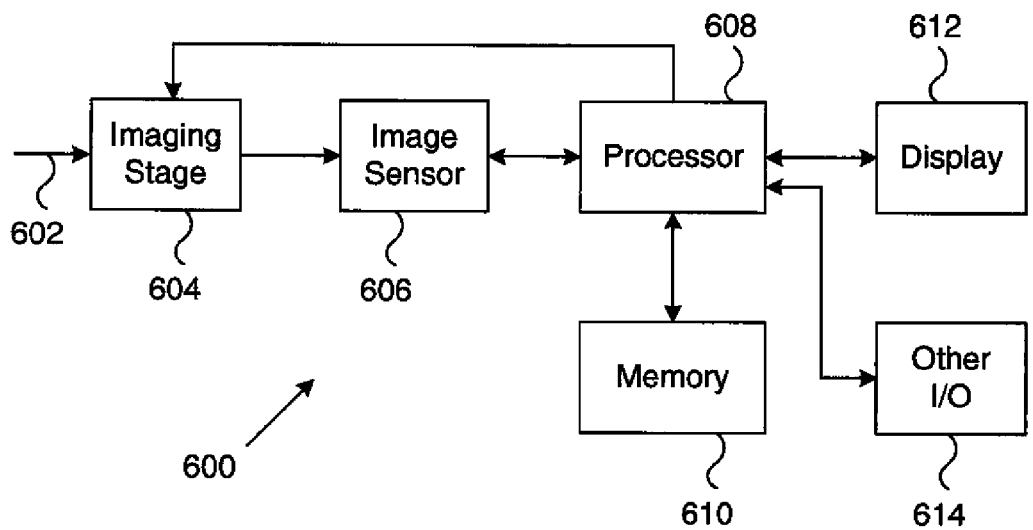
FIG. 6 is a block diagram of an image capture device in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, charge, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the terms "semiconductor layer" and "wafer" are to be understood as a semiconductor-based material including, but not limited to, silicon, silicon-on-insulator (SOI) technology, silicon-on-sapphire (SOS) technology, doped and undoped semiconductors, epitaxial layers or well regions formed on a semiconductor substrate, and other semiconductor structures.

Referring to the drawings, like numbers indicate like parts throughout the views.

The present invention is described herein with respect to a particular integrated electrical component, a back-illuminated image sensor. Those skilled in the art will appreciate that the use of embodiments of the present invention is not limited to back-illuminated image sensors. Embodiments of the present invention can be employed in any electrical component having a semiconductor layer or semiconductor material overlying a bond pad and a wire affixed to the bond pad through an opening in the semiconductor layer. FIG. 6 is a block diagram of an image capture device in an embodiment in accordance with the invention. Image capture device 600 is implemented as a digital camera in FIG. 6. Those skilled in the art will recognize that a digital camera is only one example of an image capture device that can utilize an image sensor incorporating the present invention. Other types of image capture devices, such as, for example, cell phone cameras, scanners, and digital video camcorders can be used with the present invention.

In digital camera 600, light 602 from a subject scene is input to an imaging stage 604. Imaging stage 604 can include conventional elements such as a lens, a neutral density filter, an iris and a shutter. Light 602 is focused by imaging stage 604 to form an image on image sensor 606. Image sensor 606 captures one or more images by converting the incident light into electrical signals. Image sensor 606 is implemented as a back-illuminated x-y addressable image sensor in an embodiment in accordance with the invention. One example of an x-y addressable image sensor is a Complementary Metal Oxide Semiconductor (CMOS) image sensor.

Digital camera 600 further includes processor 608, memory 610, display 612, and one or more additional input/output (I/O) elements 614. Although shown as separate elements in the embodiment of FIG. 6, imaging stage 604 may be integrated with image sensor 606, and possibly one or more additional elements of digital camera 600, to form a camera module. For example, a processor or a memory may be integrated with image sensor 606 in a camera module in embodiments in accordance with the invention.

Processor 608 may be implemented, for example, as a microprocessor, a central processing unit (CPU), an application-specific integrated circuit (ASIC), a digital signal processor (DSP), or other processing device, or combinations of multiple such devices. Various elements of imaging stage 604 and image sensor 606 may be controlled by timing signals or other signals supplied from processor 608.

Memory 610 may be configured as any type of memory, such as, for example, random access memory (RAM), read-only memory (ROM), Flash memory, disk-based memory, removable memory, or other types of storage elements, in any combination. A given image captured by image sensor 606 may be stored by processor 608 in memory 610 and presented on display 612. Display 612 is typically an active matrix color liquid crystal display (LCD), although other types of displays may be used. The additional I/O elements 614 may include, for example, various on-screen controls, buttons or other user interfaces, network interfaces, or memory card interfaces.

It is to be appreciated that the digital camera shown in FIG. 6 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 7:
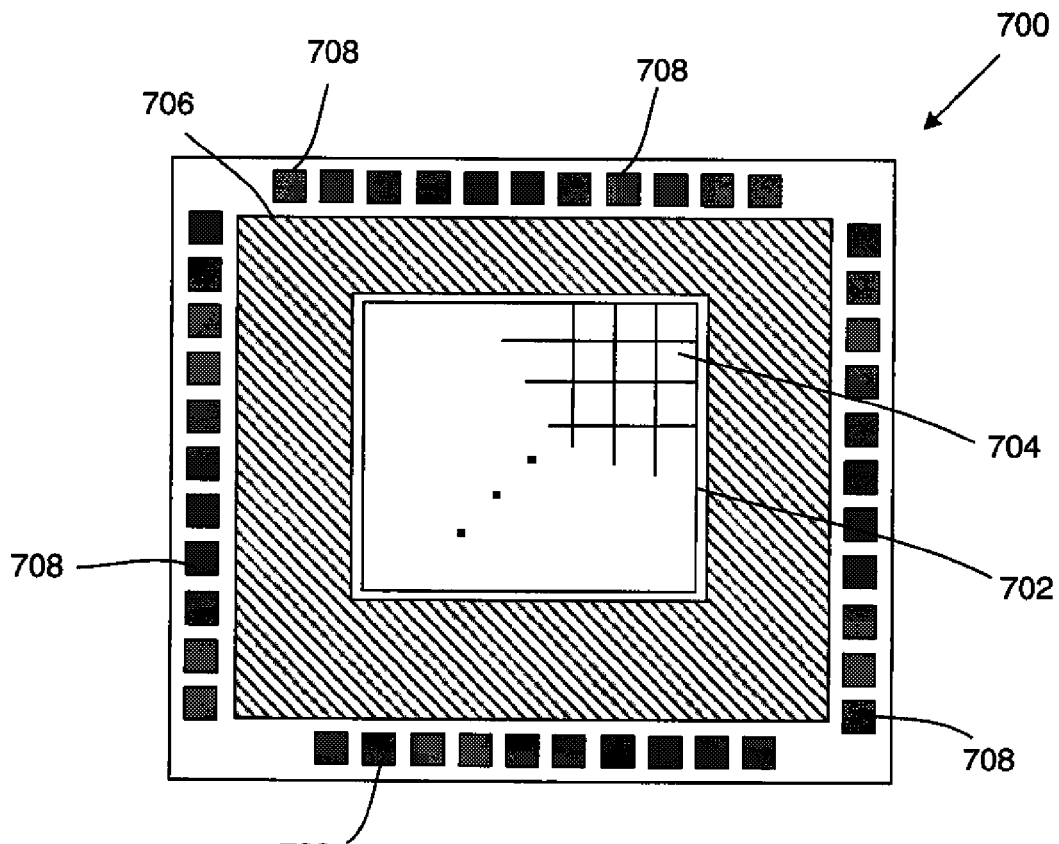
FIG. 7 is a simplified top view of an image sensor suitable for use as image sensor 606 in an embodiment in accordance with the invention.

Referring now to FIG. 7, there is shown a simplified top view of an image sensor suitable for use as image sensor 606 in an embodiment in accordance with the invention. As described earlier, image sensor 700 is implemented as a back-illuminated image sensor. Image sensor 700 includes an imaging area 702 having pixels 704 that are used to capture images. Pixels 704 can be arranged in any design or pattern, such as, for example, in rows and columns that form an array. Each pixel 704 can include a photosensitive area (not shown in FIG. 7) that converts light into an electrical charge representative of the amount of light received by the photosensitive area. Each pixel can further include one or more electrical components or circuits (not shown) that are used to output an electrical signal representative of the amount of electrical charge collected by the photosensitive area. An exemplary architecture for a pixel is described in more detail in conjunction with FIG. 8.

Image sensor 700 further includes non-imaging area 706. Non-imaging area 706 is disposed outside of and surrounding imaging area 702, and includes circuits and components that sample, read out, and process corresponding image data from imaging area 702 in an embodiment in accordance with the invention. The circuits and components in non-imaging area 706 can also provide one or more signals associated with sampling, reading out, and processing the image data. By way of example only, in a Complementary Metal Oxide Semiconductor (CMOS) image sensor non-imaging area 706 can include row and column addressing circuits, digital logic, memory, timing generators, sample and hold circuits, correlated double sampling, and analog or digital output circuits.

Functionality associated with the sampling and read out of imaging area 702 and the processing of corresponding image data may be implemented at least in part in the form of software that is stored in memory 610 and executed by processor 608 (see FIG. 6). Portions of the sampling and read out circuitry may be arranged external to image sensor 606, or formed integrally with imaging area 702, for example, on a common integrated circuit with photosensitive areas and other elements of imaging area 702. Those skilled in the art will recognize that other peripheral circuitry configurations or architectures can be implemented in other embodiments in accordance with the invention.

Image sensor 700 also includes bond pads 708. Bond pads 708 are positioned outside of, and surround non-imaging area 706 in an embodiment in accordance with the invention. Bond pads 708 can be situated in different locations in other embodiments in accordance with the invention. Bond pads 708 permit one or more signals to be transmitted to, or received from image sensor 700. Each bond pad 708 can be electrically connected to a circuit or component in non-imaging area 706 or in imaging area 702.

Figure 8:
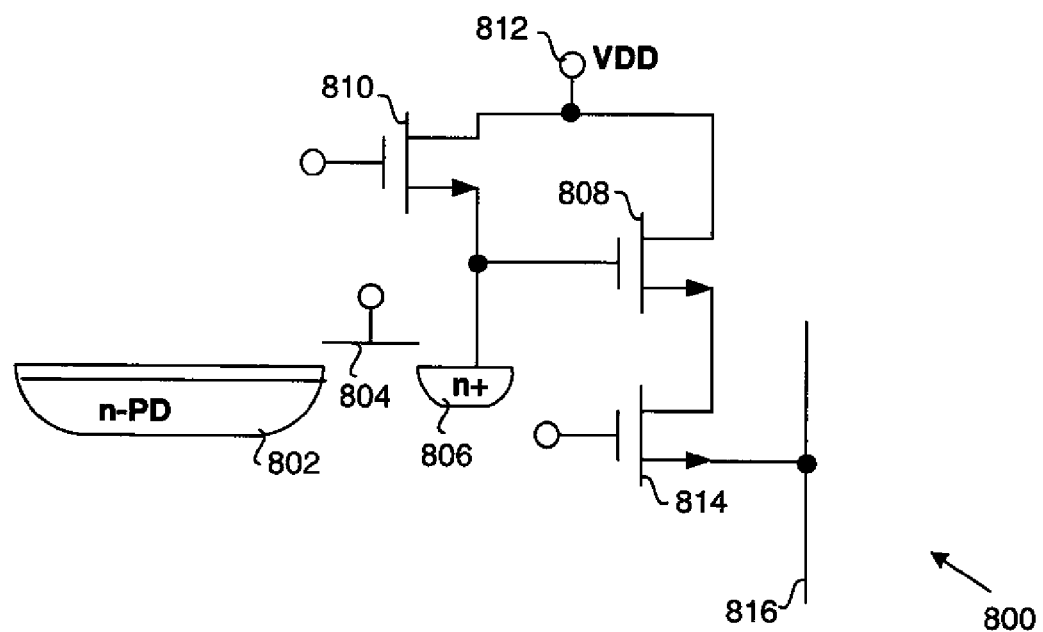
FIG. 8 is a schematic of a pixel suitable for use as pixel 704 in image sensor 606 in an embodiment in accordance with the invention.

FIG. 8 is a schematic of a pixel suitable for use as pixel 704 in image sensor 606 in an embodiment in accordance with the invention. Pixel 800 includes photosensitive area 802, transfer gate 804, charge-to-voltage conversion mechanism 806, amplifier 808, reset transistor 810, potential $V_{DD}$ 812, and row select transistor 814, whose drain is connected to the source of amplifier 808 and whose source is connected to output line 816. The drains of reset transistor 810 and amplifier 808 are maintained at potential $V_{DD}$ 812. The source of reset transistor 810 and the gate of amplifier 808 are connected to charge-to-voltage conversion mechanism 806.

Photosensitive area 802 converts light into an electrical charge in response to light striking photosensitive area 802. The amount of charge collected by photosensitive area 802 depends on the amount of light that falls on photosensitive area 802, in terms of both intensity and duration. At the end of an integration period for photosensitive area 802, the accumulated charge is transferred to charge-to-voltage conversion mechanism 806 using transfer gate 804. Charge-to-voltage conversion mechanism 806 converts the charge into a voltage. Charge-to-voltage conversion mechanism 806 is configured as a floating diffusion in an embodiment in accordance with the invention.

Reset transistor 810 resets pixel 800 by setting charge-to-voltage conversion mechanism 806 to potential $V_{DD}$ 812. Amplifier 808 amplifies the voltage in charge-to-voltage conversion mechanism 806. Amplifier 808 is implemented as a source follower transistor in an embodiment in accordance with the invention. Row select transistor 814 is used to select a row or line of pixels. When row select transistor 814 is active, the voltage on amplifier 808 is transferred to output line 816 and subsequently read out from the pixel array and the image sensor.

Pixels in other embodiments in accordance with the invention may be implemented differently from pixel 800. By way of example only, a pixel may omit one or more elements, such as charge-to-voltage conversion mechanism 806, or share elements in other embodiments in accordance with the invention. Exemplary alternative pixel architectures are disclosed in U.S. Pat. Nos. 5,949,061, 6,107,655, and 6,218,656.

Figure 9:
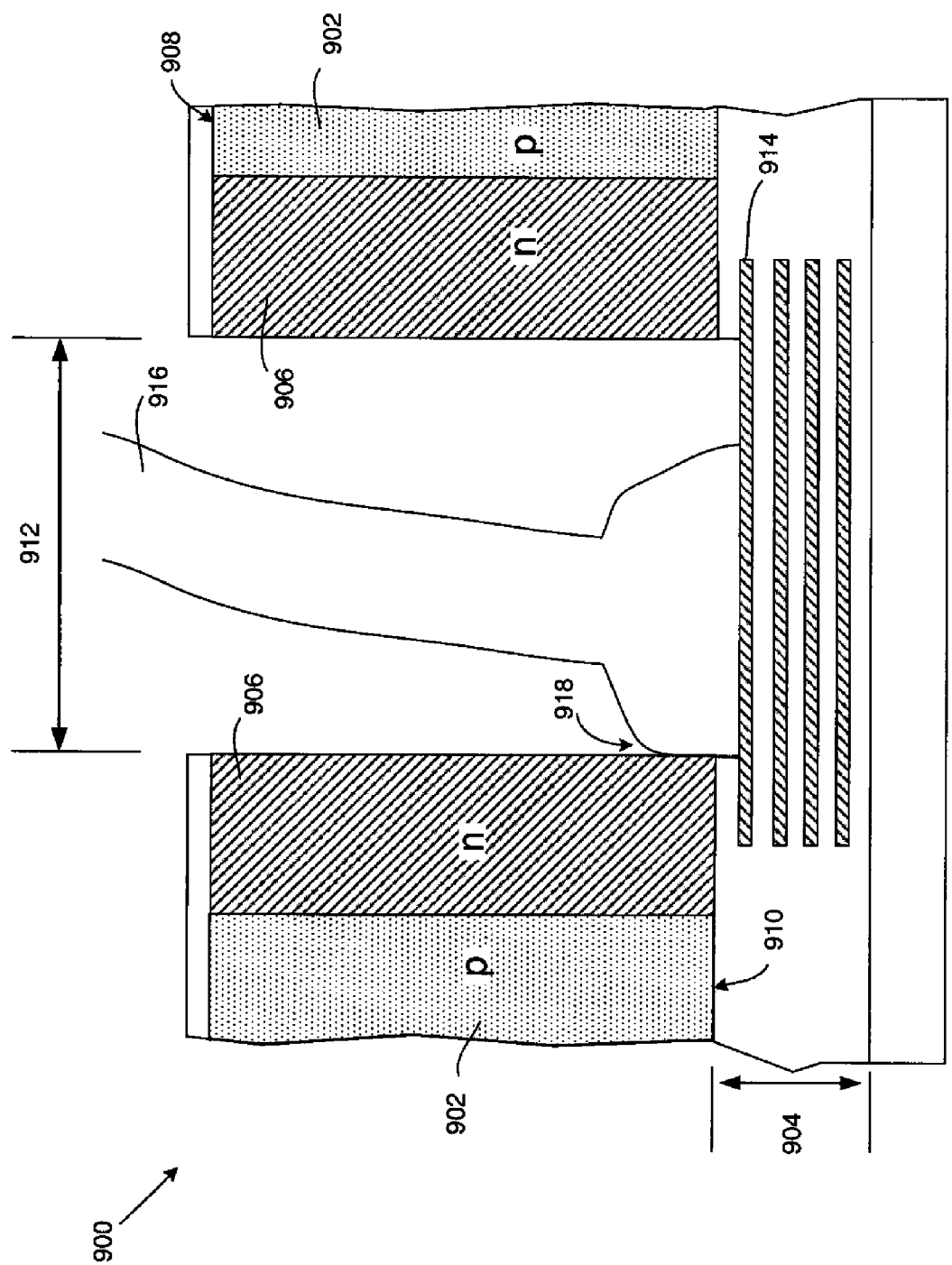
FIG. 9 is a graphical depiction of a first isolation technique in an embodiment in accordance with the invention.

Referring now to FIG. 9, there is shown a graphical depiction of a first isolation technique in an embodiment in accordance with the invention. Electrical component 900, illustrated as a back-illuminated image sensor, includes semiconductor layer 902 and interconnect layer 904. In the embodiment shown in FIG. 9, semiconductor layer 902 is formed with a semiconductor material having a p-type conductivity.

Region 906 having an n-type conductivity is formed in semiconductor layer 902. Region 906 extends from the backside 908 of semiconductor layer 902 to the frontside 910 of semiconductor layer 902. Opening 912 is formed through semiconductor layer 902 to expose at least a portion of bond pad 914. Region 906 surrounds and abuts a perimeter of opening 912 in an embodiment in accordance with the invention.

Wire 916 is affixed or connected to bond pad 914 using techniques known in the art. When wire 916 contacts semiconductor layer 902, such as at area 918, n-type region 906 and p-type semiconductor layer 902 form a reverse biased diode that prevents an electrical short by electrically isolating contact area 918 from semiconductor layer 902.

FIGS. 10A-10E are cross-sectional views of a bond pad region that are used to depict a method for fabricating the first isolation technique shown in FIG. 9 in an embodiment in accordance with the invention. For the sake of clarity, only the processes used to form the structure of FIG. 9 are described. Those skilled in the art will recognize that additional manufacturing processes can be performed in addition to the ones described herein, or additional components in an image sensor can be formed simultaneously with the processes described herein.

Figure 10A:
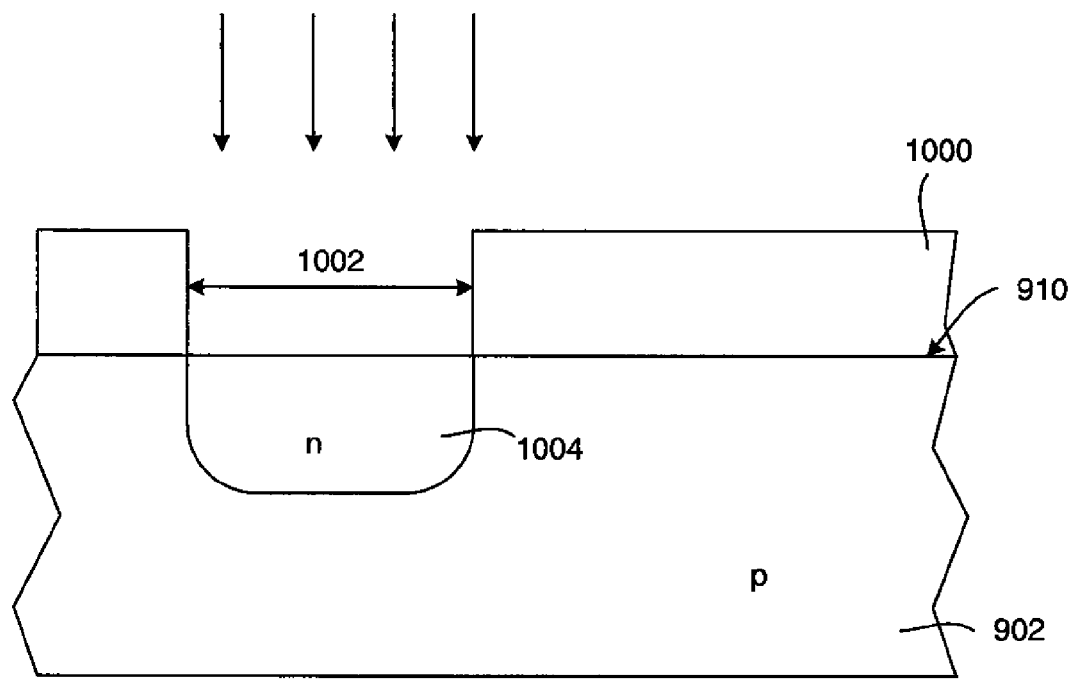
FIGS. 10A-10E are cross-sectional views of a bond pad region that are used to depict a method for fabricating the first isolation technique shown in FIG. 11 in an embodiment in accordance with the invention.

Initially, a masking layer 1000 is deposited on the frontside 910 of semiconductor layer 902 and patterned to form opening 1002 (see FIG. 10A). N-type dopants are then implanted (as represented by the arrows) into semiconductor layer 902 to form n-type well 1004.

Figure 10B:
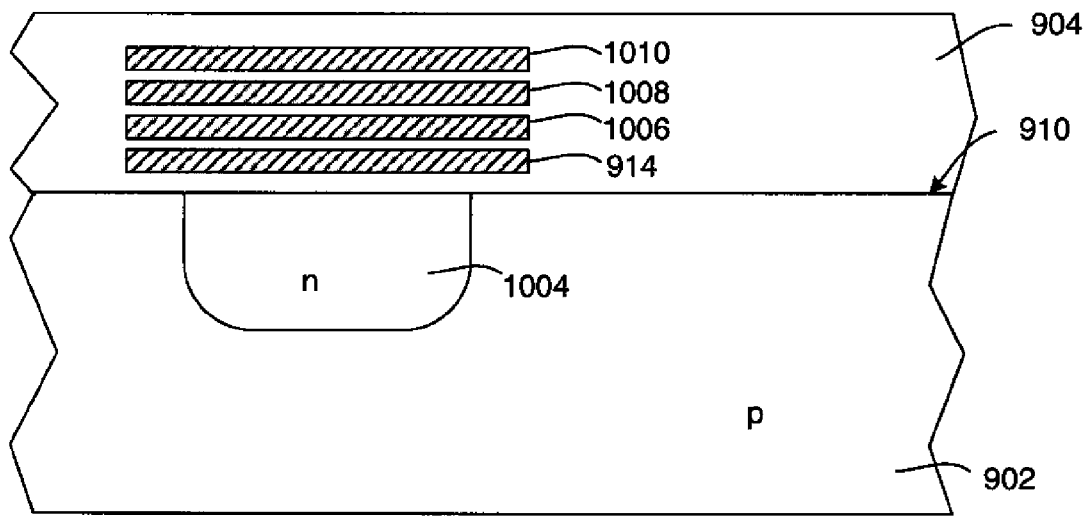

Next, as shown in FIG. 10B, masking layer 1000 is removed and a dielectric material that forms interconnect layer 904 is deposited on the frontside 910 of semiconductor layer 902. Interconnect layers 1006, 1008, 1010 and bond pad 914 are formed in interconnect layer 904 using techniques known in the art.

Figure 10C:
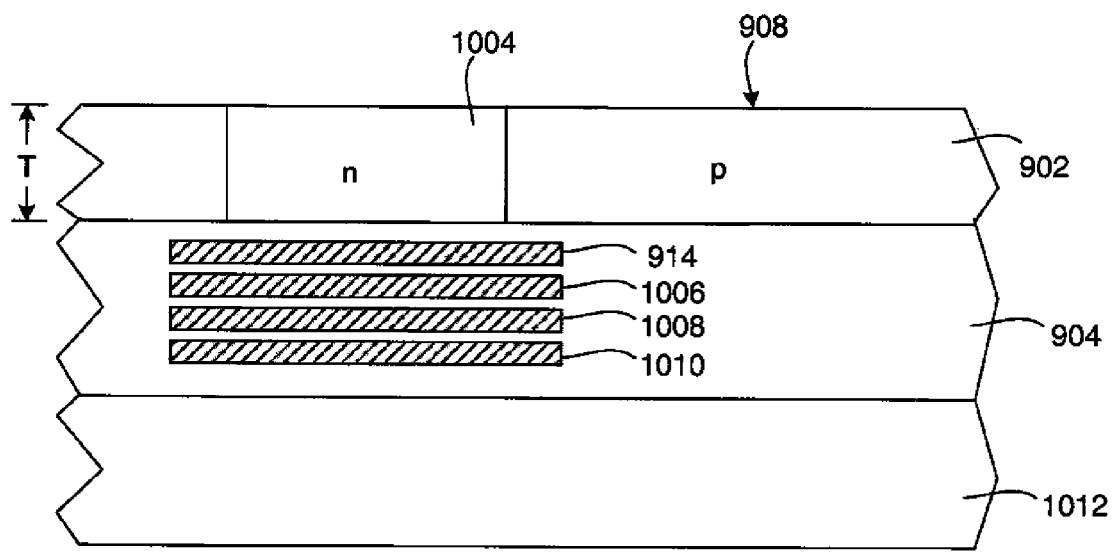

Semiconductor layer 902 and interconnect layer 904 are then flipped over or rotated one hundred and eighty degrees and interposer wafer 1012 affixed to interconnect layer 904 (see FIG. 10C). Interposer wafer 1012 is affixed to interconnect layer 904 using one or more techniques known in the art. The backside 908 of semiconductor layer 902 is then thinned until semiconductor layer 902 is at a given thickness (T). Semiconductor layer 912 can be thinned using techniques known in the art.

Figure 10D:
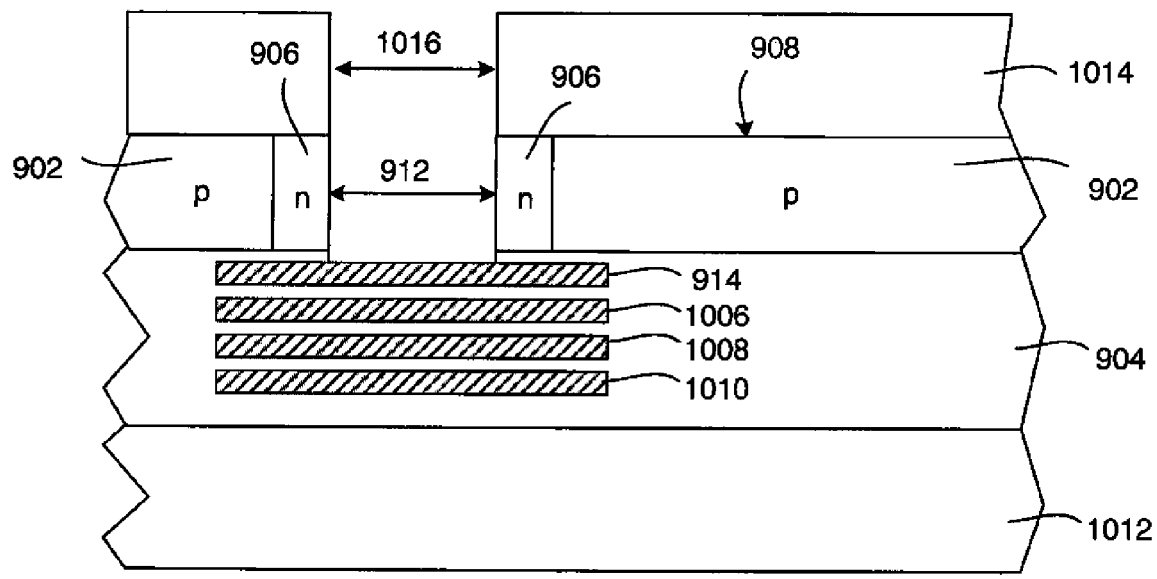

Next, as shown in FIG. 10D, a masking layer 1014 is deposited over the backside 908 of semiconductor layer 902 and patterned to form opening 1016. Opening 912 is then formed through n-type well 1004 in semiconductor layer 902 to expose a portion of bond pad 914. Opening 912 can be formed in semiconductor layer 902 using techniques known in the art. The portion of n-type well 1004 that remains in semiconductor layer 902 forms region 906 that surrounds and abuts the perimeter of opening 912.

Figure 10E:
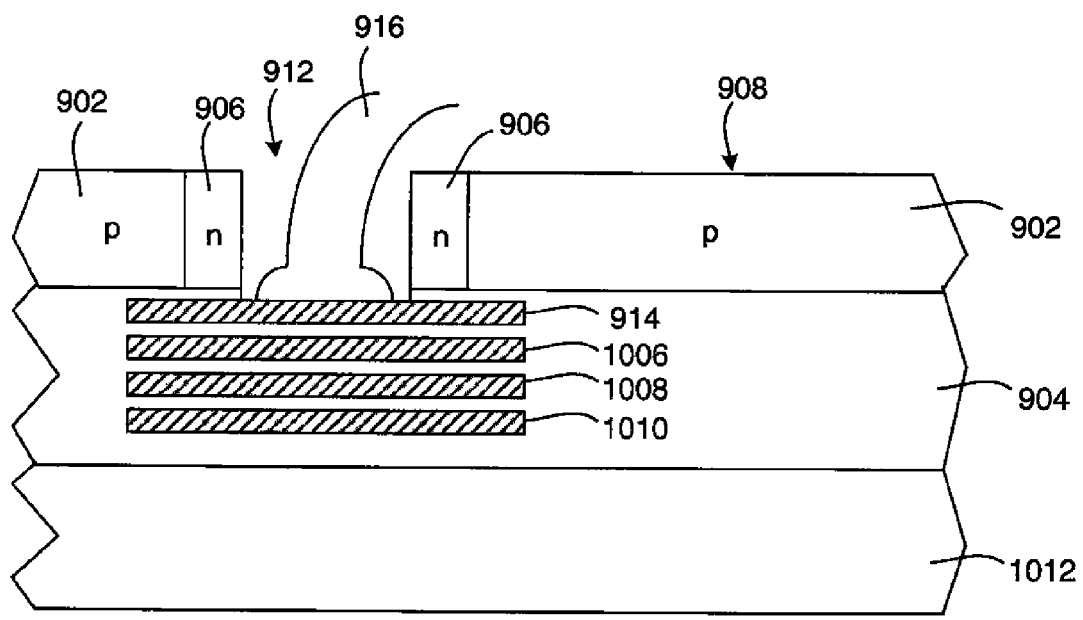

Masking layer 1014 is then removed and wire 916 affixed or connected to bond pad 914, as shown in FIG. 10E. Although FIGS. 10A-10E depict region 906 with an n-type conductivity and semiconductor layer 902 with a p-type conductivity, other embodiments can form region 906 with a p-type conductivity and semiconductor layer 902 with an n-type conductivity.

Figure 11:
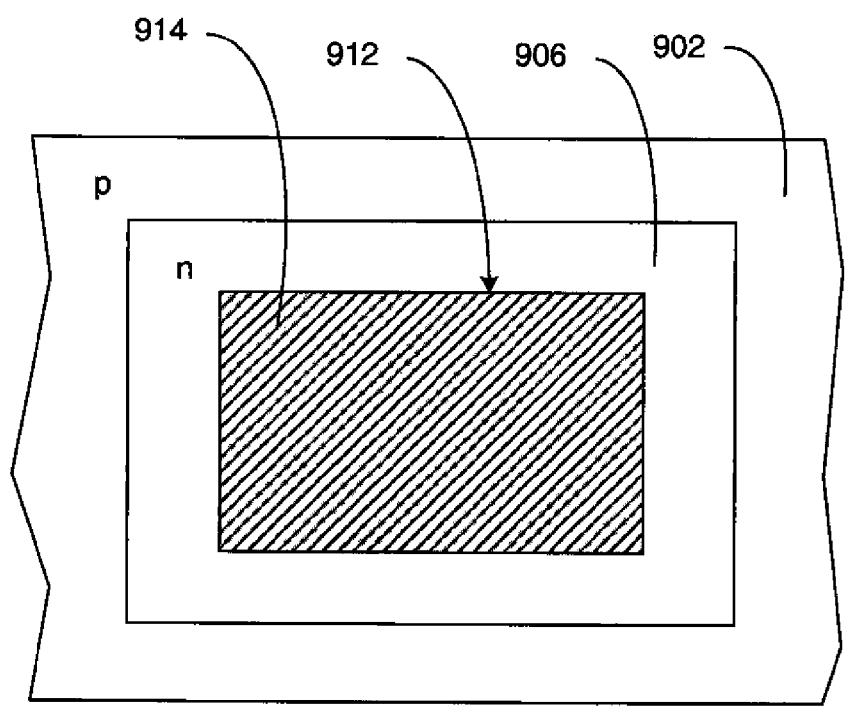
FIG. 11 is a top view of opening 912 shown in FIG. 10E before wire 916 is affixed to bond pad 914 in an embodiment in accordance with the invention.

Referring now to FIG. 11, there is shown a top view of opening 912 shown in FIG. 10E before wire 916 is affixed to bond pad 914 in an embodiment in accordance with the invention. Opening 912 exposes at least a portion of bond pad 914. Region 906 surrounds and abuts the perimeter of opening 912. Semiconductor layer 902 surrounds and abuts region 906. Although opening 912, region 906, and semiconductor layer 902 are each depicted in FIG. 11 as having a rectangular shape, those skilled in the art will recognize that opening 912, region 906, or semiconductor layer 902 can each have any given shape.

Figure 12:
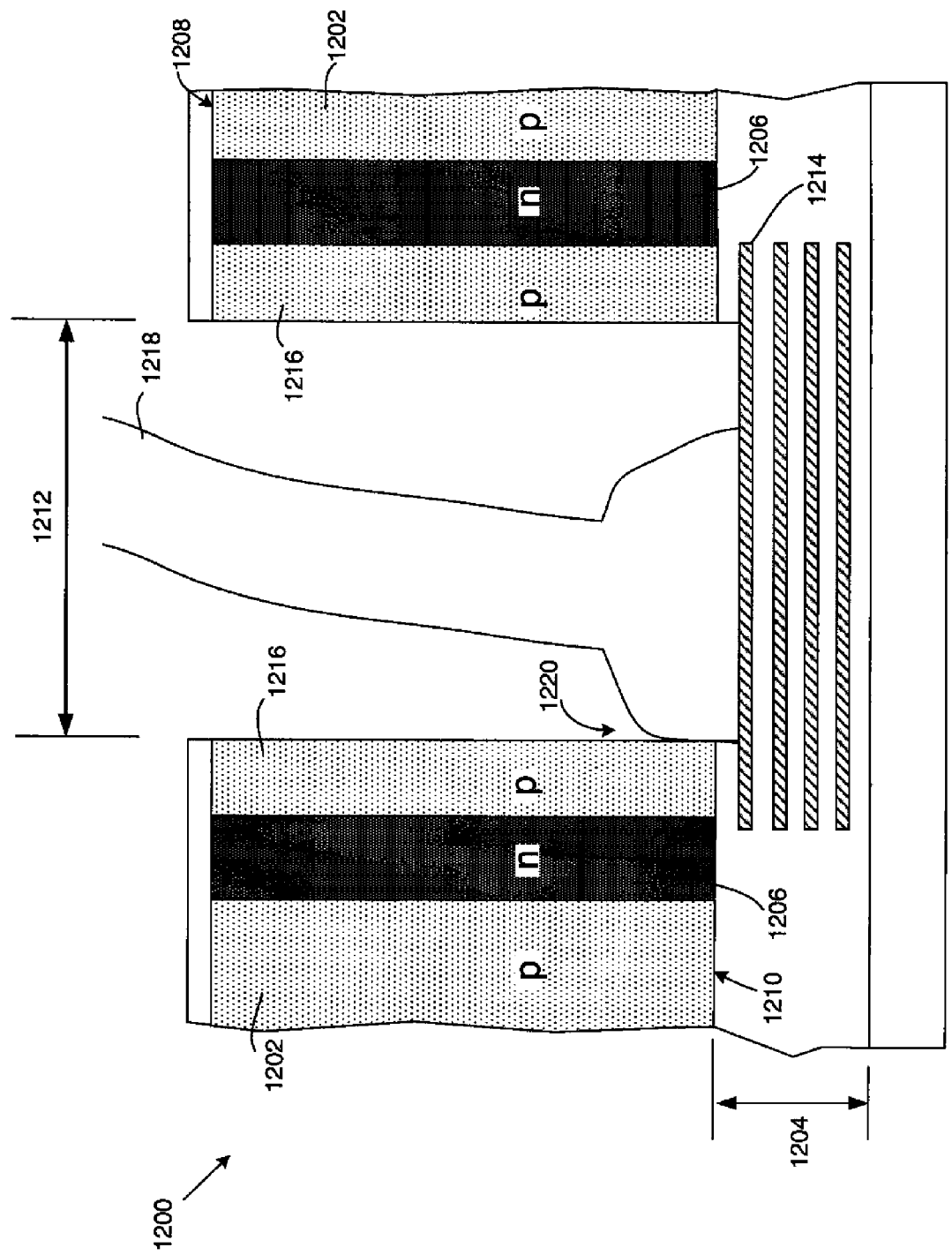
FIG. 12 is a graphical illustration of a second isolation technique in an embodiment in accordance with the invention.

FIG. 12 is a graphical depiction of a second isolation technique in an embodiment in accordance with the invention. Electrical component 1200, illustrated as a back-illuminated image sensor, includes semiconductor layer 1202 and interconnect layer 1204. In the embodiment shown in FIG. 12, semiconductor layer 1202 is formed with a semiconductor material having a p-type conductivity.

Region 1206 having an n-type conductivity is formed in semiconductor layer 1202. Region 1206 extends from the backside 1208 of semiconductor layer 1202 to the frontside 1210 of semiconductor layer 1202. Opening 1212 is formed through semiconductor layer 1202 to expose at least a portion of bond pad 1214. Region 1206 surrounds but does not abut the perimeter of opening 1212 in an embodiment in accordance with the invention. Instead, region 1216 having a p-type conductivity is positioned between region 1206 and the perimeter of opening 1212. Region 1216 can have the same dopant type and dopant concentration as semiconductor layer 1202, or region 1216 can include a different dopant or a different dopant concentration than semiconductor layer 1202.

Wire 1218 is connected to bond pad 1214. When wire 1218 contacts semiconductor layer 1202, such as at area 1220, p-type region 1216, n-type region 1206, and p-type semiconductor layer 1202 prevent wire 1218 from producing an electrical short to semiconductor layer 1202.

FIGS. 13A-13E are cross-sectional views of a bond pad region that are used to depict a method for fabricating the second isolation technique shown in FIG. 12 in an embodiment in accordance with the invention. For the sake of clarity, only the processes used to form the structure of FIG. 12 are described. Those skilled in the art will recognize that additional manufacturing processes can be performed in addition to the ones described herein, or additional components in an image sensor can be formed simultaneously with the processes described herein.

Figure 13A:
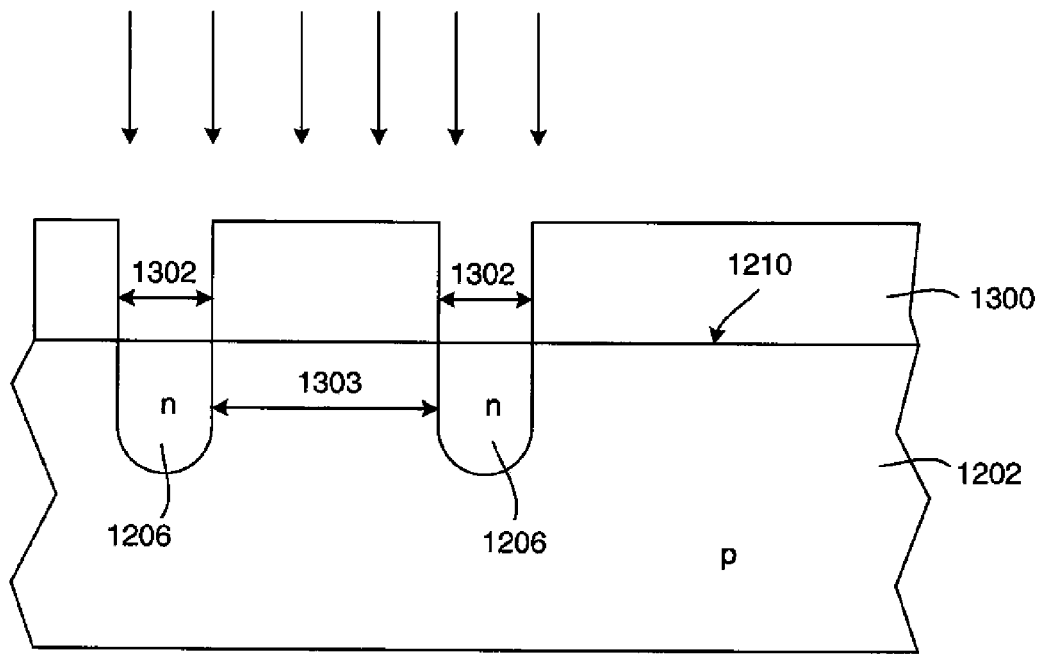
FIGS. 13A-13F are cross-sectional views of a bond pad region that are used to depict a method for fabricating the second isolation technique shown in FIG. 12 in an embodiment in accordance with the invention.

Initially, a masking layer 1300 is deposited on the frontside 1210 of semiconductor layer 1202 and patterned to form opening 1302 (see FIG. 13A). N-type dopants are then implanted (as represented by the arrows) into semiconductor layer 1202 to form n-type region 1206. N-type region 1206 surrounds a portion 1303 of semiconductor layer 1202.

Figure 13B:
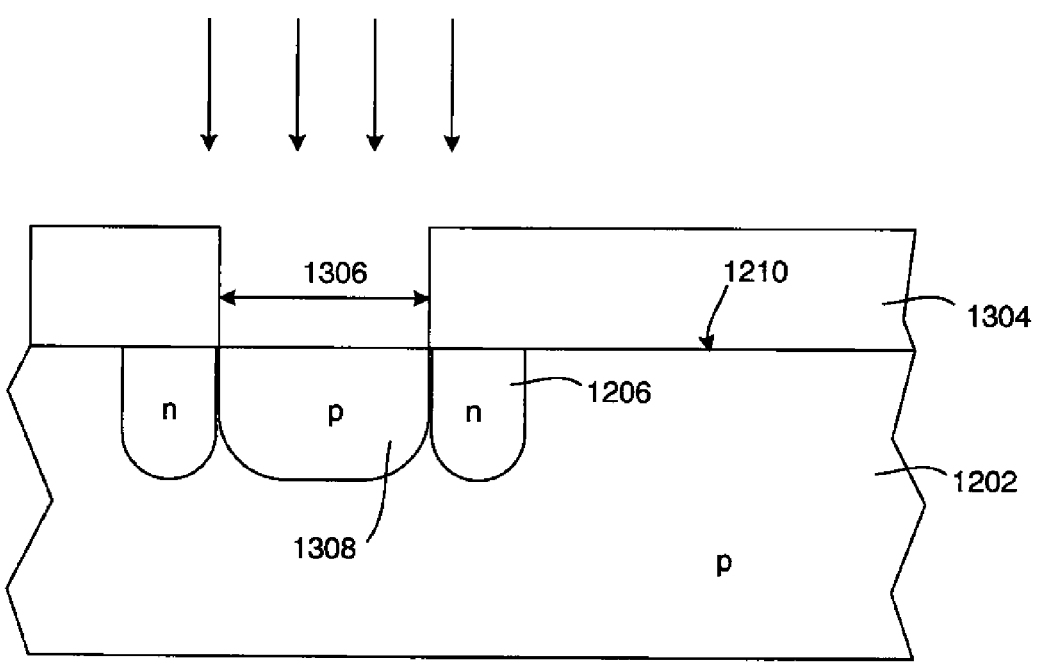

Next, as shown in FIG. 13B, masking layer 1300 is removed and another masking layer 1304 deposited on frontside 1210 and patterned to form opening 1306. P-type dopants are then implanted (as represented by the arrows) into the enclosed portion 1303 of semiconductor layer 1202 to form p-type well 1308. The processes illustrated in FIG. 13B are optional and well 1308 is not formed in another embodiment in accordance with the invention. Instead, the p-type semiconductor material in the enclosed portion 1303 of semiconductor layer 1202 is not doped with additional p-type dopants.

Figure 13C:
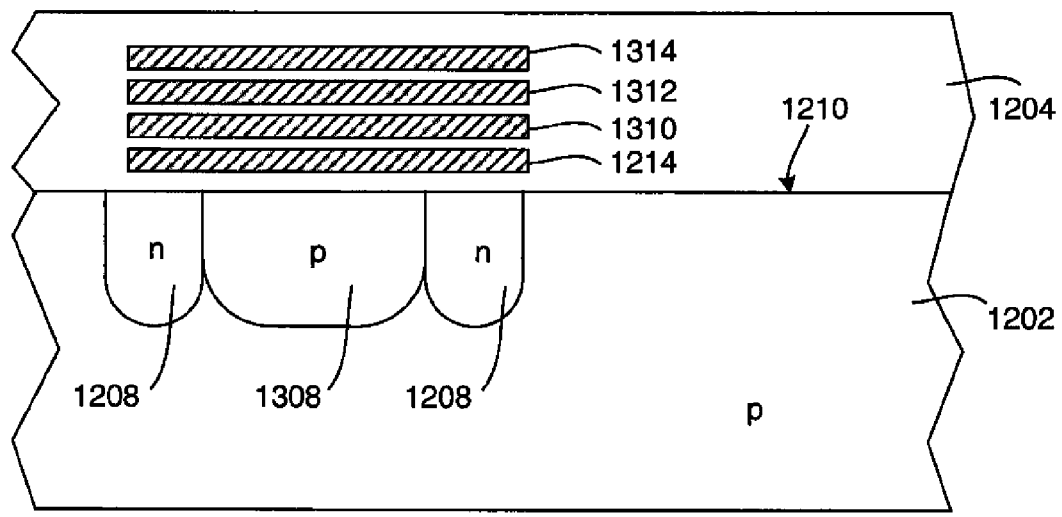

Masking layer 1304 is then removed and dielectric material that forms interconnect layer 1204 is deposited on the frontside 1210 of semiconductor layer 1202 (see FIG. 13C). Interconnect layers 1310, 1312, 1314 and bond pad 1214 are formed in interconnect layer 1204 using techniques known in the art.

Figure 13D:
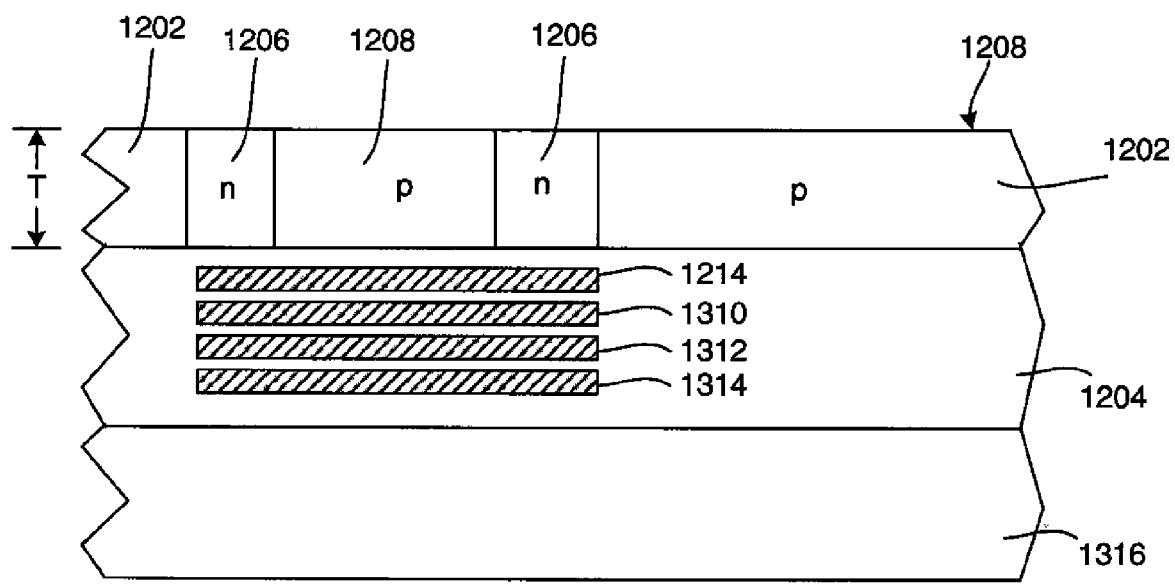

Next, as shown in FIG. 13D, semiconductor layer 1202 and interconnect layer 1204 are flipped over or rotated one hundred and eighty degrees and interposer wafer 1316 affixed to interconnect layer 1204. Interposer wafer 1316 is affixed to interconnect layer 1204 using one or more techniques known in the art. The backside 1208 of semiconductor layer 1202 is then thinned until semiconductor layer 1202 is at a given thickness (T). Semiconductor layer 1202 can be thinned using techniques known in the art.

Figure 13E:
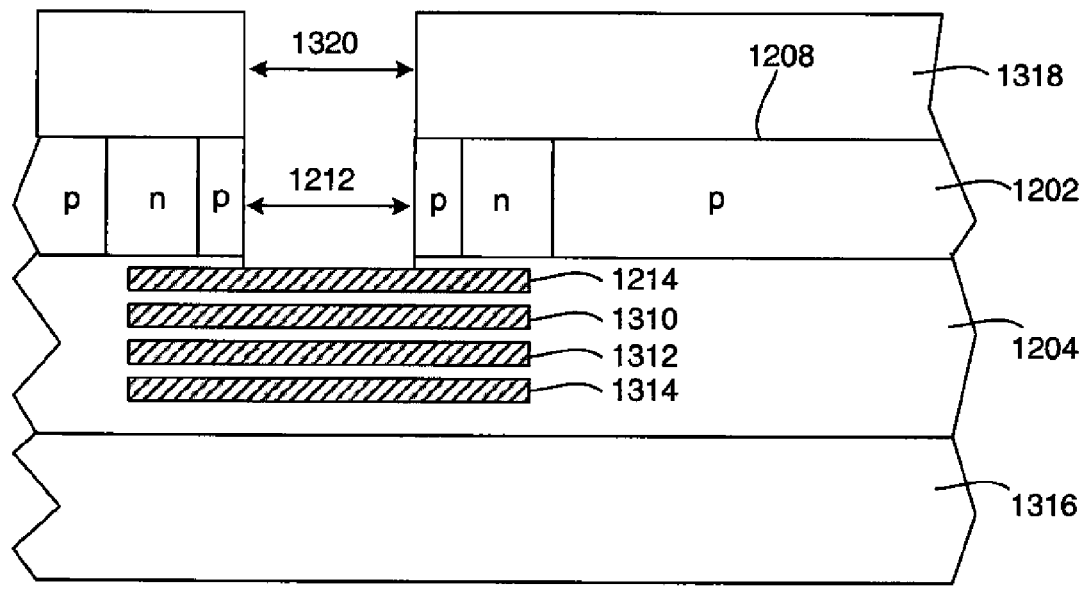

A masking layer 1318 is then deposited over backside 1208 and patterned to form opening 1320 (see FIG. 13E). Opening 1212 is formed through p-type well 1308 in semiconductor layer 1202 to expose a portion of bond pad 1214. The portion of p-type well 1308 that remains in semiconductor layer 1202 forms region 1216 that surrounds and abuts the perimeter of opening 1212.

Figure 13F:
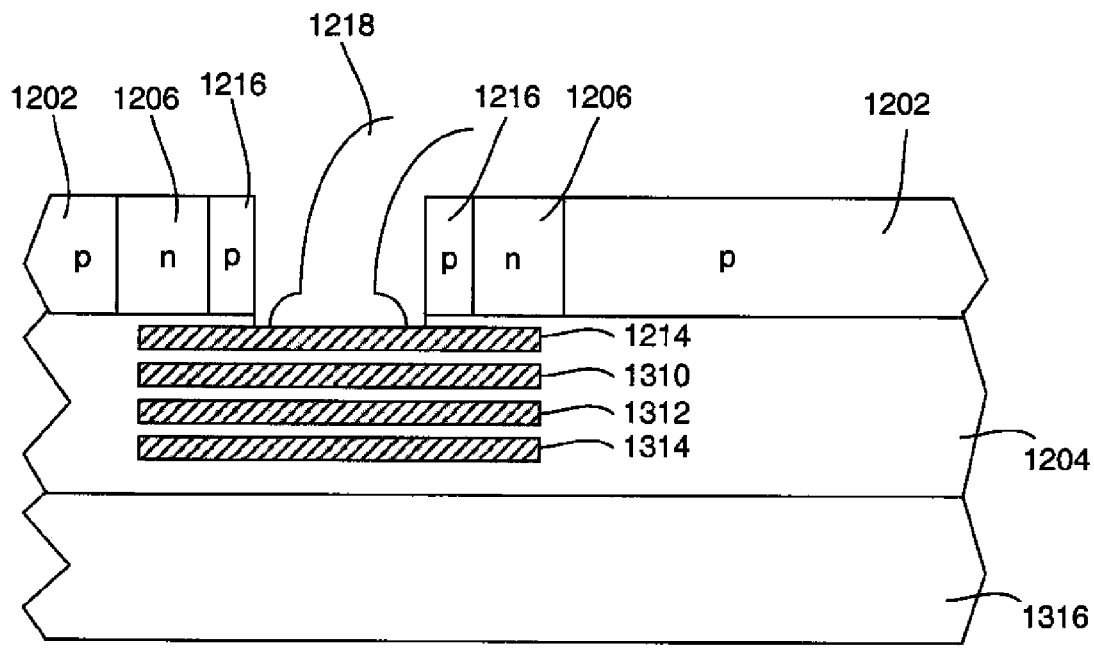

Next, as shown in FIG. 13F, masking layer 1318 is removed and wire 1218 affixed or connected to bond pad 1214. Although FIGS. 13A-13F depict region 1216 and semiconductor layer 1202 with a p-type conductivity and region 1206 with an n-type conductivity, other embodiments in accordance with the invention can form semiconductor layer 1202 and region 1216 with an n-type conductivity and region 1206 with a p-type conductivity.

Figure 14:
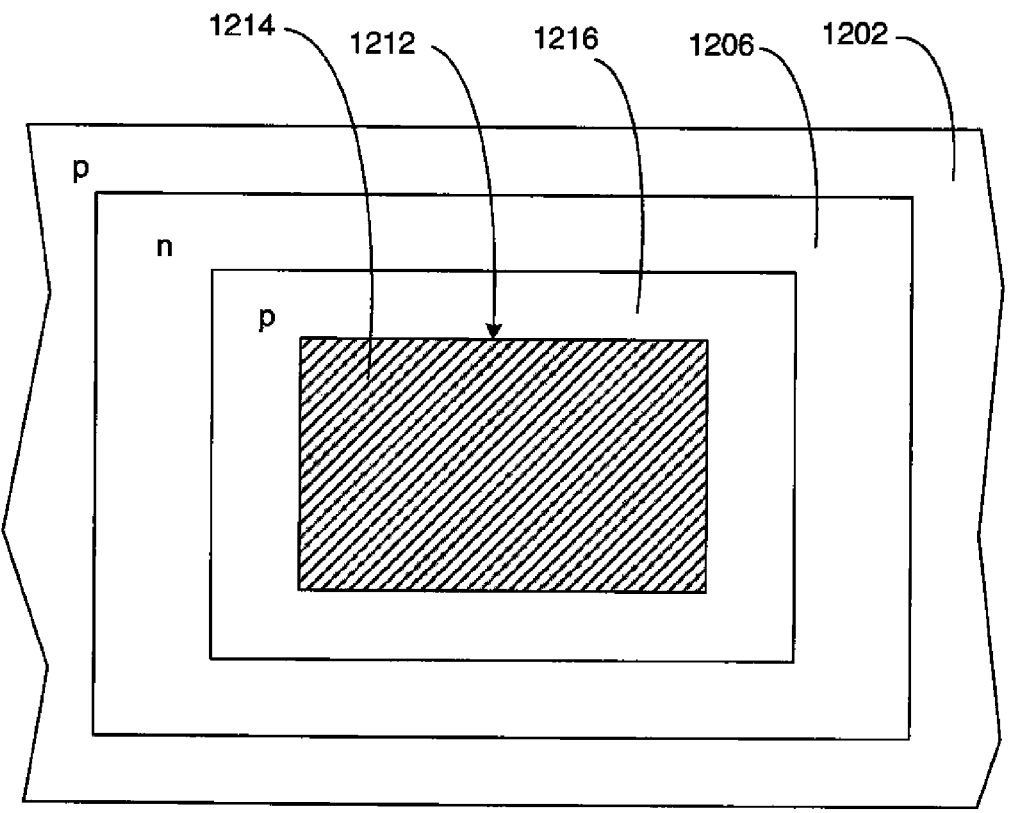
FIG. 14 is a top view of opening 1212 shown in FIG. 13F before wire 1218 is affixed to bond pad 1214 in an embodiment in accordance with the invention.

Referring now to FIG. 14, there is shown a top view of opening 1212 shown in FIG. 13F before wire 1218 is affixed to bond pad 1214 in an embodiment in accordance with the invention. Opening 1212 exposes at least a portion of bond pad 1214. Region 1216 surrounds and abuts the perimeter of opening 1212. Region 1216 can be produced using a doped well formed in semiconductor layer 1202 (see FIG. 13B) or with the semiconductor material in semiconductor layer 1202. Region 1206 surrounds region 1216, or surrounds a portion of semiconductor layer 1202 when a doped well is not fabricated in semiconductor layer 1202. In the embodiment shown in FIG. 14, region 1206 surrounds region 1216.

Semiconductor layer 1202 surrounds and abuts region 1206. Although opening 1212, region 1216, region 1206, and semiconductor layer 1202 are each depicted in FIG. 14 as having a rectangular shape, those skilled in the art will recognize that opening 1212, region 1216, region 1206, or semiconductor layer 1202 can each have any given shape.

Embodiments of the present invention advantageously provide a less complex technique for isolating a wire bonded to a bond pad through an opening in a semiconductor layer or material. Embodiments of the present invention are also less costly to produce and improve performance and testing conditions for the electrical components.

The invention has been described in detail with particular reference to certain preferred embodiments thereof, but it will be understood that variations and modifications can be effected within the spirit and scope of the invention. For example, the embodiments shown in FIGS. 9-14 are described with reference to particular conductivity types. The conductivity types can be different in other embodiments in accordance with the invention. And as discussed earlier, embodiments of the invention are not limited to image sensors. The present invention can be implemented in any electrical component having a semiconductor layer or material overlying a bond pad and a wire affixed to the bond pad through an opening in the semiconductor layer or material.

Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 front-illuminated image sensor
102 pixel
104 pixel
106 pixel
108 semiconductor layer
110 interconnect layer
112 photosensitive area
114 photosensitive area
116 photosensitive area
118 conductive interconnect
120 conductive interconnect
122 conductive interconnect
124 light
126 frontside of semiconductor layer
128 backside of semiconductor layer
200 back-illuminated image sensor
202 support substrate
300 back-illuminated image sensor
302 opening
304 semiconductor layer
306 bond pad
308 interconnect layer
310 wire
312 area where wire contacts semiconductor layer
400 insulating material
402 opening
404 semiconductor layer
406 width
408 bond pad
500 deep trench isolation region
502 frontside of semiconductor layer
504 semiconductor layer
506 backside of semiconductor layer
508 wire
510 bond pad
512 area where wire contacts semiconductor layer
600 image capture device
602 light
604 imaging stage
606 image sensor
608 processor
610 memory
612 display
614 other input/output (I/O)
700 image sensor
702 imaging area
704 pixel
706 non-imaging area
708 bond pad
800 pixel
802 photosensitive area
804 transfer gate
806 charge-to-voltage conversion mechanism
808 amplifier
810 reset transistor
812 potential
814 row select transistor
816 output line
900 electrical component
902 semiconductor layer 904 interconnect layer
906 region
908 backside of semiconductor layer
910 frontside of semiconductor layer
912 opening
914 bond pad
916 wire
918 area where wire contacts semiconductor layer
1000 masking layer
1002 opening
1004 well
1006 interconnect
1008 interconnect
1010 interconnect
1012 interposer wafer
1014 masking layer
1016 opening
1200 electrical component
1202 semiconductor layer
1204 interconnect layer
1206 region
1208 backside of semiconductor layer
1210 frontside of semiconductor layer
1212 opening
1214 bond pad
1216 region
1218 wire
1220 area where wire contacts semiconductor layer
1300 masking layer
1302 opening
1303 portion of semiconductor layer surrounded by region 1206
1304 masking layer
1306 opening
1308 well
1310 interconnect
1312 interconnect
1314 interconnect
1316 interposer wafer
1318 masking layer
1320 opening

The invention claimed is:

1. A method for isolating a wire affixed to a bond pad in an integrated circuit device, the method comprising:

forming a first region having a first conductivity type in a portion of a semiconductor layer, the semiconductor layer having a second conductivity type and having at least one integrated circuit formed therein, wherein the first region surrounds a portion of the semiconductor layer and extends from a backside of the semiconductor layer to a frontside of the semiconductor layer, and wherein the first conductivity type is opposite the second conductivity type;

forming an opening from the backside of the semiconductor layer through the semiconductor layer to expose at least a portion of a bond pad disposed in an interconnect layer formed on the frontside of the semiconductor layer, wherein the first region surrounds the opening; and forming a well of the second conductivity type in the portion of the semiconductor layer surrounded by the first region.

2. The method as in claim 1, further comprising thinning the semiconductor layer to a given thickness prior to forming the opening, wherein the first region and the well both extend from the backside of the thinned semiconductor layer to the frontside of the thinned semiconductor layer.

3. The method as in claim 2, wherein forming an opening from a backside of the semiconductor layer through the semiconductor layer to expose at least a portion of the bond pad comprises forming an opening through a backside of the semiconductor layer through the well to expose at least a portion of the bond pad, wherein the remaining portion of the well abuts and surrounds a perimeter of the opening.

4. The method as in claim 1, wherein forming an opening through a backside of the semiconductor layer through the semiconductor layer to expose at least a portion of the bond pad comprises forming an opening through a backside of the semiconductor layer through the surrounded portion of the semiconductor layer to expose at least a portion the bond pad such that the first region surrounds the opening but does not abut a perimeter of the opening.

\* \* \* \* \*